(12) United States Patent
Sugiura et al.

(10) Patent No.: US 6,411,091 B1
(45) Date of Patent: Jun. 25, 2002

(54) COIL FOR MRI APPARATUS

(75) Inventors: Sunao Sugiura; Yoshiya Sato, both of Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/976,719

(22) Filed: Oct. 13, 2001

(30) Foreign Application Priority Data

Dec. 5, 2000 (JP) ........................................ 2000-370617

(51) Int. Cl.$^7$ ................................................ G01V 3/00
(52) U.S. Cl. ........................ 324/318; 324/309; 324/322
(58) Field of Search ................................. 324/318, 322, 324/307, 309, 320; 335/299

(56) References Cited

U.S. PATENT DOCUMENTS 5,477,145 A * 12/1995 Matsunaga et al. ......... 324/318
5,578,925 A * 11/1996 Braum et al. ............... 324/318
6,181,227 B1 * 1/2001 Schmidt et al. ............. 324/318

* cited by examiner

Primary Examiner—Edward Lefkowitz
Assistant Examiner—Brij B. Shrivastav
(74) Attorney, Agent, or Firm—Moonray Kojima

(57) ABSTRACT

With the objective of reducing the coupling capacitance of a pattern crossing section in a simple structure thereby to produce a high-quality tomographic image based on a larger value of the coil, a magnetic resonance signal receiving coil includes a pair of first and second conductor patterns each having a partial conductor pattern set which branches into three partial conductor patterns at the pattern crossing section. Each confronting pair of the first and second partial conductor patterns cross each other by being insulated from each other at the pattern crossing section. The partial conductor patterns of the first and second conductor patterns have their one ends beyond the crossing section each connected together to other ends of the second and first conductor patterns by arcuate conductors. The conductor patterns have their open ends connected to the signal outlets by conductor bars.

6 Claims, 9 Drawing Sheets

COIL FOR MRI APPARATUS

BACKGROUND OF THE INVENTION

The present invention relates to a coil for an MRI apparatus which forms at least two loops, and particularly to a coil for an MRI apparatus which is capable of enhancing the coupling characteristics of the reception coil by having a reduced coupling capacitance at the crossing section of the loops.

An MRI apparatus have been designed to implement the imaging process by detecting with a reception coil a magnetic signal which is created by the nuclear magnetic resonance. FIG. 7 is a diagram showing a developed view of a conventional saddle-type reception coil. In FIG. 7, a coil 101 forms a pair of loop coils 201 and 202 on the right and left, and the loop coils 201 and 202 are connected in series. The loop coils 201 and 202 have conductor patterns 105 and 106 which form loop conductor patterns 107 and a pattern crossing section 111. Disposed between the conductor pattern 106 and conductor pattern 107 is a resonance capacitor C1, which is connected to a cable section 103 for leading out a signal received by the coil 101. A balance/unbalance converting circuit such as an impedance matching circuit and balun is provided between the resonance capacitor C1 and the cable section 103.

The conductor patterns 105 and 106 cross each other at the pattern crossing section 111. FIG. 8 is a diagram showing the detailed structure of the pattern crossing section 111. In FIG. 8, the conductor patterns 105 and 106 cross each other by being interposed by a glass-epoxy substrate 121 which is an insulator. The conductor patterns 105 and 106 cross each other at right angles in order to reduce their magnetic coupling.

Based on this structure, there exists at the pattern crossing section 111 a coupling capacitance C, which is expressed in terms of the crossing area S of the conductor patterns 105 and 106, the thickness d of the glass-epoxy substrate 121, and the dielectric constant $\epsilon$ of the glass-epoxy substrate 121 as in the following formula (1).

$$C = \epsilon S/d \tag{1}$$

The conductor patterns 105 and 106 have a width D, and the formula (1) is reformed as in the following formula (2).

$$C = \epsilon \cdot (D \times D)/d \tag{2}$$

The conductor patterns 105 and 106 have their width D set large in order to reduce the resistance component of the coil. Consequently, the crossing area S is large. The glass-epoxy substrate 121 has its thickness d set small due to the limited layout space and cost of the coil 101. On this account, the coupling capacitance C of the pattern crossing section 111 is nonnegligible with respect to the resonance capacitor C1.

FIG. 9 is a diagram showing an equivalent circuit of the coil 101. This equivalent circuit forms a parallel resonance circuit. The impedance characteristic of this equivalent circuit is represented by a resonance curve which has a large impedance value at the resonant frequency fc as shown in FIG. 10. Generally, a coil has its Q value expressed in terms of the inductance L of the coil, the resistance component r of the coil, and the resonant frequency $\omega$ as in the following formula (3).

$$Q = \omega L/r = fc/\Delta f \tag{3}$$

By setting a 3-dB band width $\Delta f$ of the peak value on the resonance curve of FIG. 10, the Q value is evaluated by the formula (3). The resonant frequency fc relates to $\omega$ as $\omega = 2\pi fc$, and the S/N factor (signal to noise ratio), which is a crucial parameter indicative of the quality of the tomographic image produced by the MRI apparatus, relates to the Q value as in the following formula (4).

$$S/N \sqrt{(Q)} \tag{4}$$

As described above, the resistance component r increases with the increase of the coupling capacitance C, which results in a decreased Q value as suggested by the formula (3). The smaller Q value of the coil deteriorates the S/N factor as suggested by the formula (4), which results in a degraded quality of tomographic image. Namely, an increase of coupling capacitance C of the pattern crossing section 111 reduces the Q value of the coil 101, which gives rise to a problem of a degraded quality of tomographic image.

SUMMARY OF THE INVENTION

Therefore, it is an object of the present invention to provide a coil for an MRI apparatus which is designed to reduce the coupling capacitance C of the pattern crossing section 111 based on a simple structure so that the Q value of the coil 101 does not decrease, thereby producing a high-quality tomographic image.

In order to achieve the above objective, the coil for an MRI apparatus according to the first aspect resides in a coil for an MRI apparatus which forms a plurality of loops and has an insulated crossing section, and is characterized by including a first conductor pattern which forms a first loop and has its one end at the crossing section branching into a set of a prescribed number of first partial conductor patterns, and a second conductor pattern which forms a second loop and has its one end at the crossing section branching into a set of the prescribed number of second partial conductor patterns, and is further characterized in that each confronting pair of the first and second partial conductor pattern sets cross each other by being insulated from each other at the crossing section, and the adjacent first partial conductor patterns and adjacent second partial conductor patterns have their ends beyond the crossing section each connected together to other ends of the second conductor pattern and first conductor pattern by conductors which are spaced out from the second partial conductor patterns and first partial conductor patterns, respectively, by a prescribed distance or more.

The coil for an MRI apparatus according to the first aspect is designed to reduce the coupling capacitance of the crossing section based on the structure in which each confronting pair of the first and second partial conductor patterns each formed in a prescribed number of branches cross each other by being insulated from each other at the crossing section, and the first and second partial conductor patterns each have their ends beyond the crossing section connected together by conductors which are spaced out from the second and first partial conductor patterns by a prescribed distance or more.

The coil for an MRI apparatus according to the second aspect resides in a coil for an MRI apparatus which forms a plurality of loops and has an insulated crossing section, and is characterized by including a first conductor pattern which forms a first loop and has its one end at the crossing section branching into first partial conductor patterns of two in number, and a second conductor pattern which forms a second loop and has its one end at the crossing section branching into second partial conductor patterns of two in number, and is further characterized in that each confronting pair of the first and second partial conductor patterns cross each other by being insulated from each other at the crossing section, and the first partial conductor patterns and second partial conductor patterns have their ends beyond the crossing section each connected together to other ends of the second conductor pattern and first conductor pattern by conductors which are spaced out from the second partial conductor patterns and first partial conductor patterns, respectively, by a prescribed distance or more.

The coil for an MRI apparatus according to the second aspect is designed to reduce the coupling capacitance of the crossing section based on the structure in which each confronting pair of the first and second partial conductor patterns each formed in two branches cross each other by being insulated from each other at the crossing section, and the first and second partial conductor patterns each have their ends beyond the crossing section connected together to another end of the second and first conductor patterns by conductors which are spaced out from the second and first partial conductor patterns by a prescribed distance or more.

The coil for an MRI apparatus according to the third is characterized in that the first and second partial conductor patterns cross each other at right angles.

The coil for an MRI apparatus according to the third aspect is designed to reduce the crossing area thereby to reduce the coupling capacitance of the crossing section based on the structure in which the first and second partial conductor patterns cross each other at right angles.

The coil for an MRI apparatus according to the fourth aspect is characterized in that the partial conductor patterns have a virtually equal width.

The coil for an MRI apparatus according to the fourth is designed to reduce the crossing area thereby to reduce the coupling capacitance of the crossing section based on the structure in which the partial conductor patterns have a virtually equal width.

Therefore, the coil for an MRI apparatus according to the first aspect is designed such that each confronting pair of the first and second partial conductor patterns each formed in a prescribed number of branches cross each other by being insulated from each other at the crossing section, and the first and second partial conductor patterns each have their ends beyond the crossing section connected together by conductors which are spaced out from the second and first partial conductor patterns by a prescribed distance or more, so that the coupling capacitance of crossing section decreases, whereby the coil can have a large Q value to produce a high-quality MRI tomographic image based on a high S/N factor.

The coil for an MRI apparatus according to the second aspect is designed such that each confronting pair of the first and second partial conductor patterns each formed in two branches cross each other by being insulated from each other at the crossing section, and the first and second partial conductor patterns each have their ends beyond the crossing section connected together to other ends of the second and first conductor patterns by conductors which are spaced out from the second and first partial conductor patterns by a prescribed distance or more, so that the coupling capacitance of the crossing section decreases, whereby the coil can have a large Q value to produce a high-quality MRI tomographic image based on a high S/N factor.

The coil for an MRI apparatus according to the third aspect is designed such that the first and second partial conductor patterns cross each other at right angles at the crossing section, so that the crossing area is decreased to reduce the coupling capacitance, whereby the coil can have a larger Q value to produce a high-quality MRI tomographic image based on a high S/N factor.

The coil for an MRI apparatus according to the fourth aspect is designed such that the partial conductor patterns have a virtually equal width at the crossing section, so that the crossing area is decreased to reduce the coupling capacitance, whereby the coil can have a larger Q value to produce a high-quality MRI tomographic image based on a high S/N factor.

Further objects and advantages of the present invention will be apparent from the following description of the preferred embodiments of the invention as illustrated in the accompanying drawings.

DETAILED DESCRIPTION OF THE INVENTION

Preferable embodiments of a coil for an MRI apparatus based on this invention will be explained in detail with reference to the attached drawings.

(Embodiment 1)

Embodiment 1 of this invention will be explained.

Figure 1:
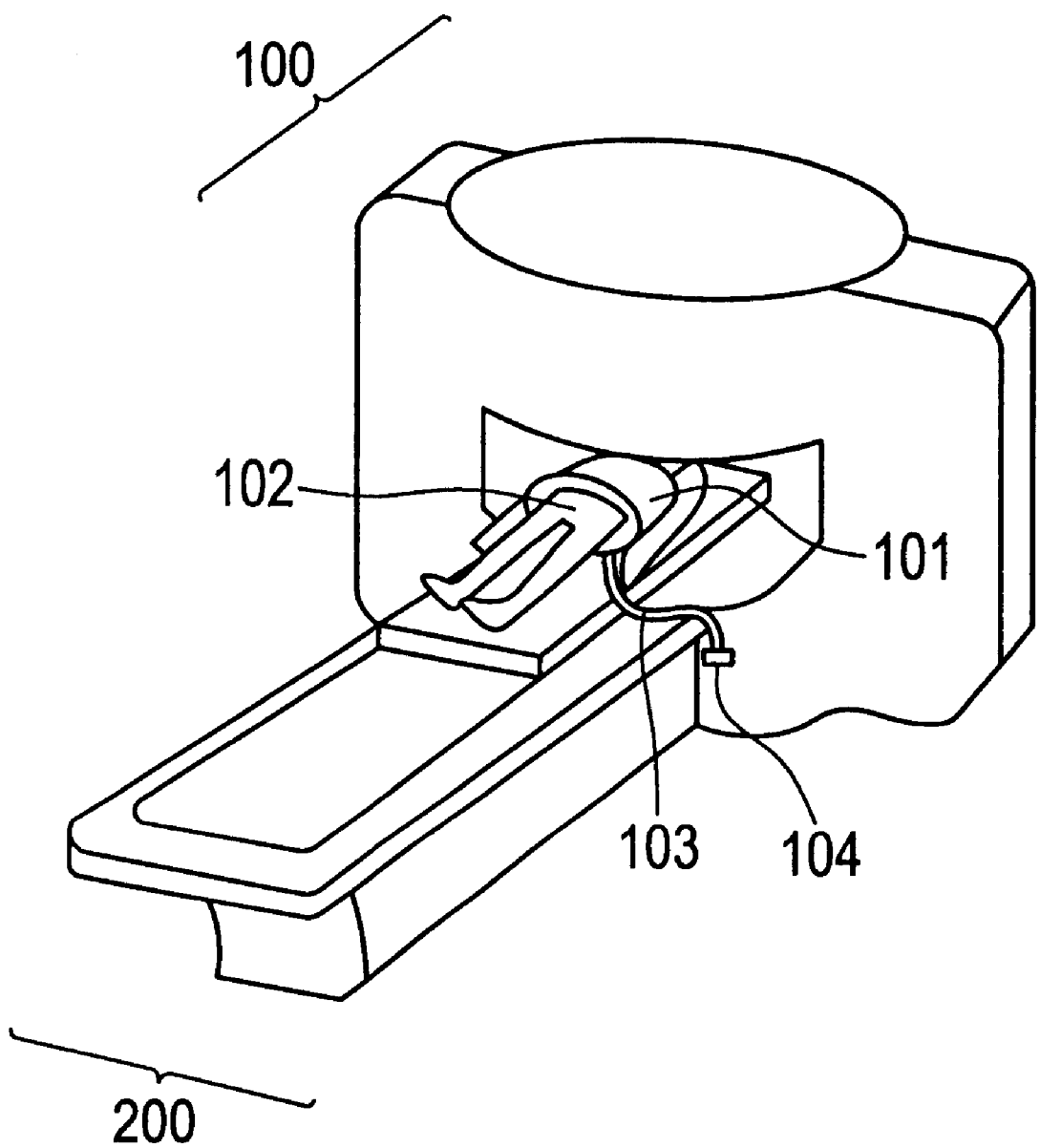
FIG. 1 is a diagram showing the overall arrangement of the MRI apparatus which uses the coil based on Embodiment 1 of this invention.

FIG. 1 is a diagram showing the overall arrangement of an MRI apparatus. In FIG. 1, this MRI apparatus has a magnet section 100 and a table section 200. Placed at the center of the magnet section 100 are a subject body 102 and a coil 101. The coil 101 is connected to the main body of the magnet section 100 through a cable section 103 and connector 104. The subject body 102 is placed to lie inside the coil 101.

Figure 2A:
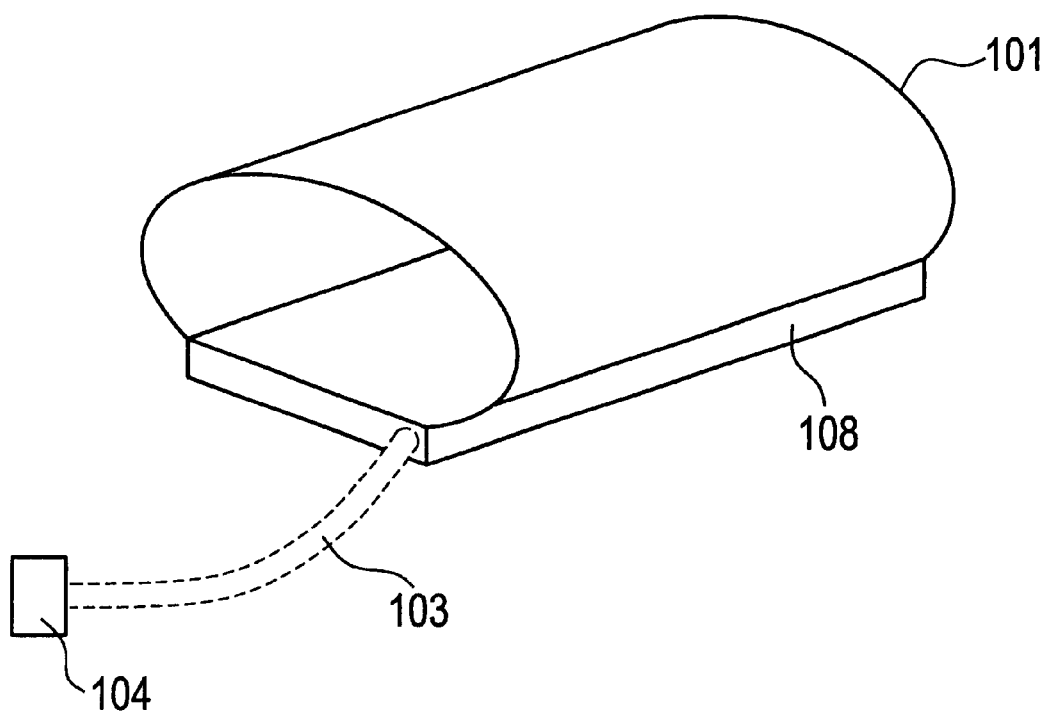
FIG. 2 is a diagram showing the structure of the coil of Embodiment 1 of this invention.
Figure 2B:
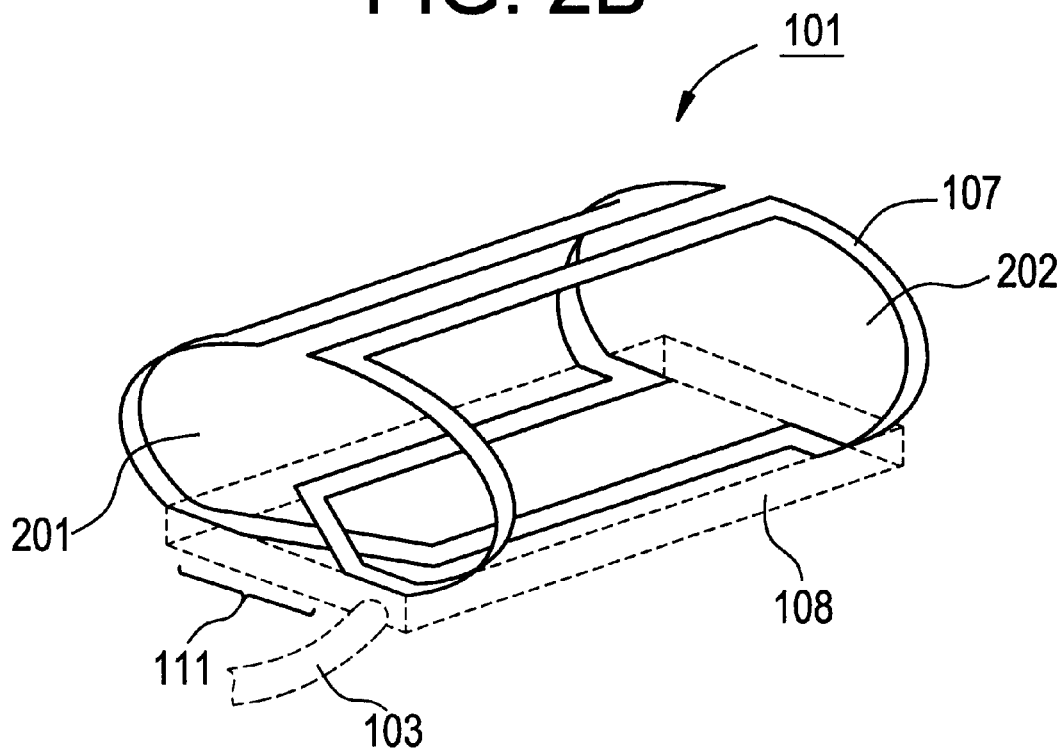

FIG. 2 is a diagram showing the detailed structure of the coil 101 shown in FIG. 1. FIG. 2(a) is a diagram showing the external view of the coil 101, and FIG. 2(b) is a diagram showing the structure of the coil 101. As shown in FIG. 2(a), the coil 101 which is covered with cloth is laid on a case 108 of plastics. The case 108 is connected with the cable section 103 for the connection to the main body of the magnet section 100, and the cable section 103 has the connection at its end with the connector 104.

The coil 101 is a saddle-type reception coil as shown in FIG. 2(b), which has the conventional formation of a pair of loop coils 201 and 202 which confront each other at the right and left positions. The conventional loop coils 201 and 202 are conductor patterns 107 formed on a printed wiring board. The coil 101 has its loop coils 201 and 202 crossing each other at the pattern crossing section 111 shown in FIG. 7.

Figure 3:
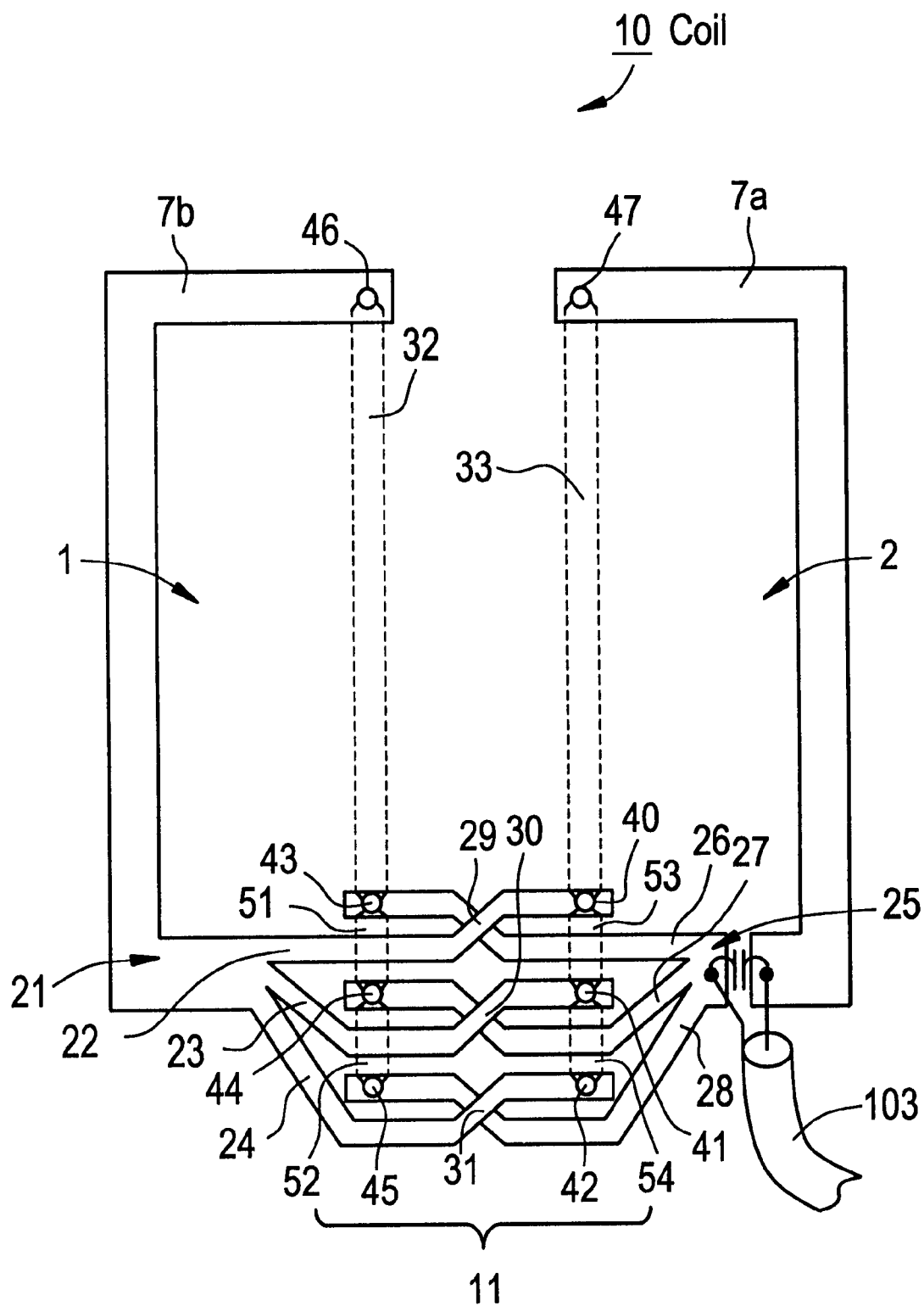
FIG. 3 is a development diagram showing the structure of the coil shown in FIG. 2.
Figure 4:
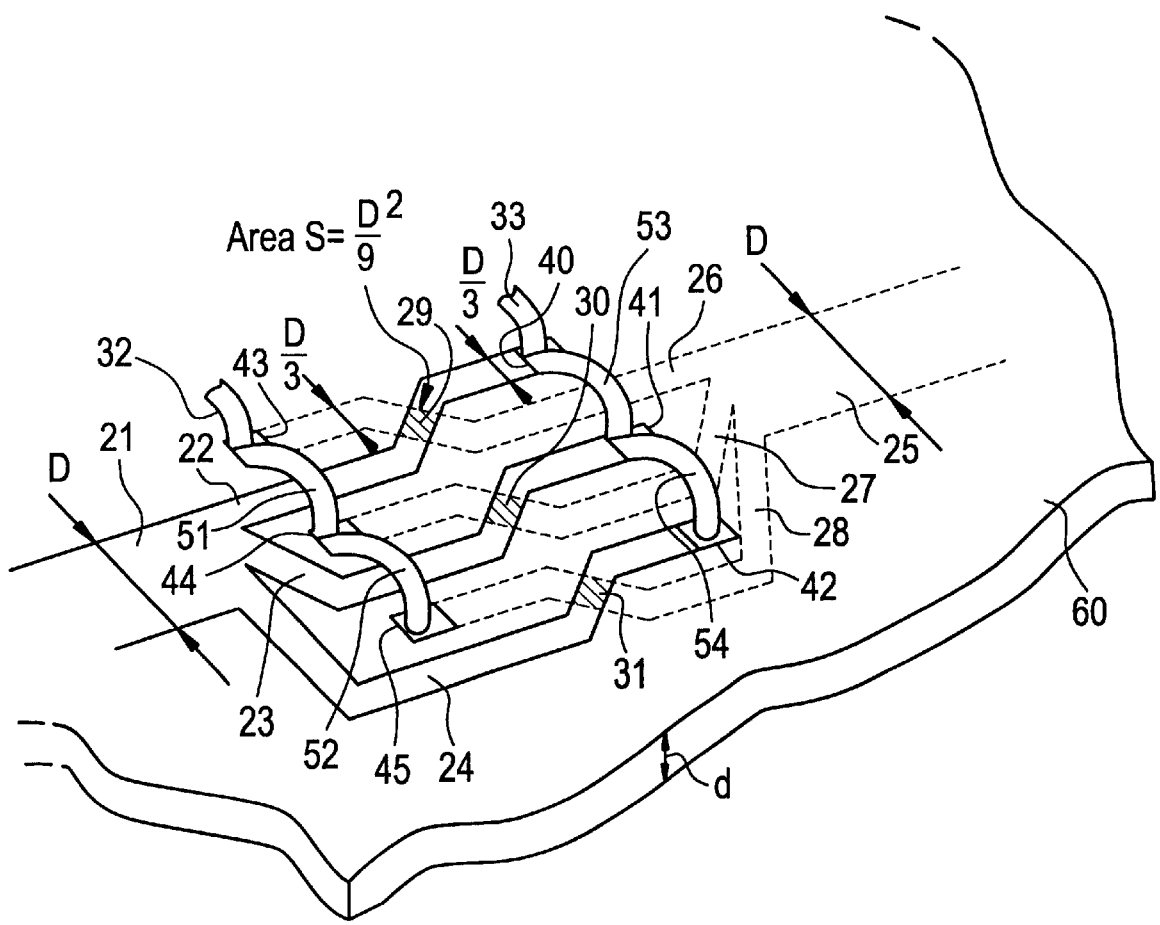
FIG. 4 is an enlarged perspective view of the pattern crossing section shown in FIG. 3.

FIG. 3 is a development diagram of a coil 10 which is derived from the coil 101 and based on Embodiment 1 of this invention. FIG. 4 is an enlarged perspective view of the pattern crossing section shown in FIG. 3.

In FIG. 3, the loop coils 1 and 2 are connected in series and arranged to cross each other by being insulated at the pattern crossing section 11. The loop coils 1 and 2 have conductor patterns 7a and 7b which form loops. The conductor pattern 7b has at the pattern crossing section 11 a partial conductor pattern set 21 of three branches of an equal width to include partial conductor patterns 22 through 24. The conductor pattern 7a has at the pattern crossing section 11 a partial conductor pattern set 25 of three branches of an equal width to include partial conductor patterns 26 through 28. Disposed between the conductor pattern 7a and the partial conductor pattern set 25 is a resonance capacitor C1, which is connected to a cable section 103 for leading out a signal received by the coil 10. A balance/unbalance converting circuit such as an impedance matching circuit and balun is provided between the resonance capacitor C1 and the cable section 103.

The partial conductor patterns 22 to 24 cross the partial conductor patterns 26 to 28 at right angles at respective pattern crossing points 29 through 31. The partial conductor patterns 22 to 24 have their ends reaching to outlets 40 through 42 which are formed in a glass-epoxy substrate 60 shown in FIG. 4, and they are connected together between 22 and 23 and between 23 and 24 by arcuate conductors 53 and 54, respectively. The outlet 40 is connected to a connection terminal 47 which is formed at another end of the conductor pattern 7a by a conductor bar 33 by being spaced out from the glass-epoxy substrate 60 by a prescribed distance.

Similarly, the partial conductor patterns 26 to 28 have their ends reaching to outlets 43 through 45 which are formed in the glass-epoxy substrate 60, and they are connected together between 26 and 27 and between 27 and 28 by arcuate conductors 51 and 52, respectively. The outlet 43 is connected to a connection terminal 46 which is formed at another end of the conductor pattern 7b by a conductor bar 32 by being spaced out from the glass-epoxy substrate 60 by the prescribed distance.

As shown in FIG. 4, the partial conductor pattern sets 21 and 25 are printed on the top and rear surfaces, respectively, of the glass-epoxy substrate 60. For the conductor patterns 7a and 7b having a width of D, the partial conductor patterns 22 to 24 and 26 to 28 have width D/3. The partial conductor patterns 22 to 24 and the partial conductor patterns 26 to 28 cross each other at right angles at the pattern crossing points 29 to 31. Accordingly, each of the pattern crossing points 29 to 31 has its crossing area S expressed by the following formula (5).

$$S = D/3 \times D/3 = D \times D/9 \quad (5)$$

Substituting the crossing area S to the formula (1) gives the following formula (6).

$$C = \epsilon \cdot (D \times D/d)/9 \quad (6)$$

Due to the parallel connection of the three pattern crossing points 29 to 31, the total coupling capacitance Ct is expressed by the following formula (6).

$$Ct = \epsilon (D \times D/d)/3 \quad (7)$$

Figure 7:
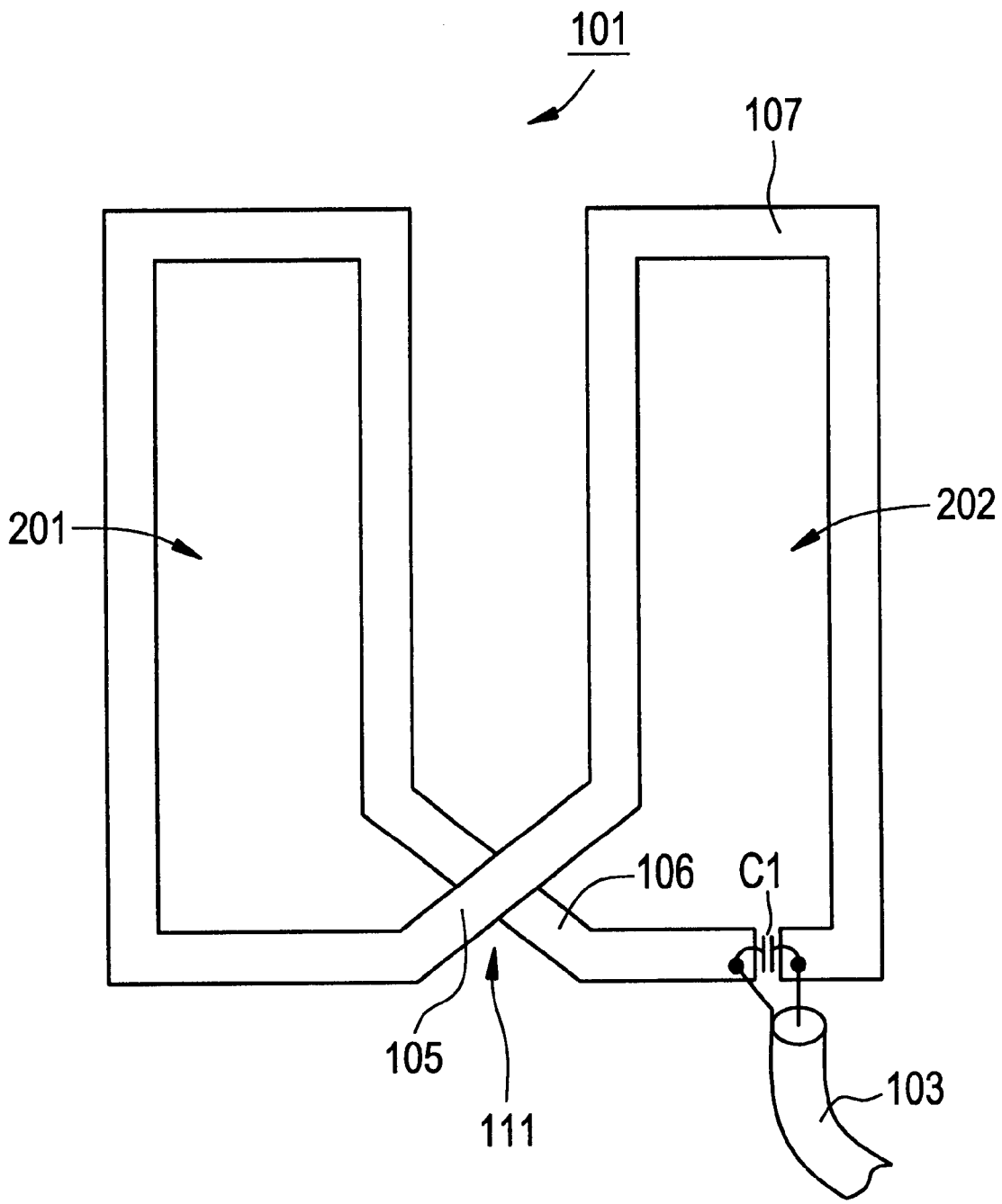
FIG. 7 is a development diagram showing the structure of the conventional coil.
Figure 8:
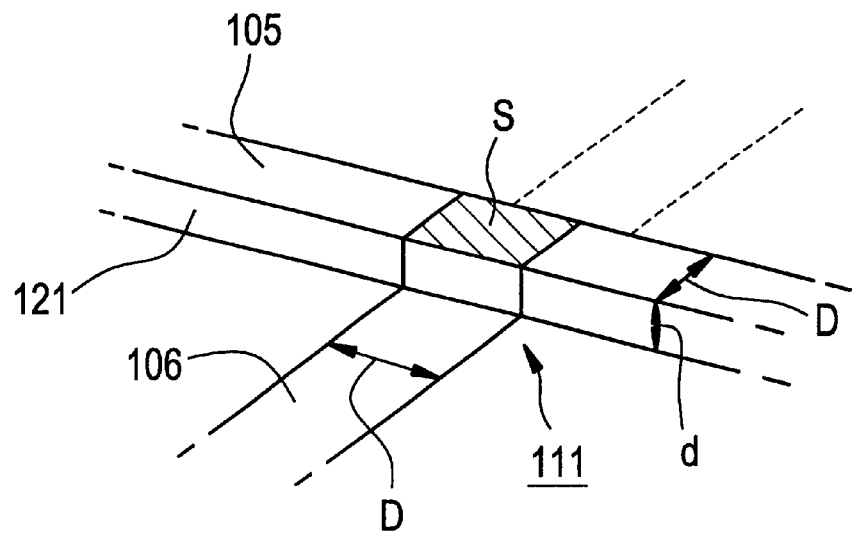
FIG. 8 is an enlarged perspective view of the pattern crossing section shown in FIG. 7.
Figure 9:
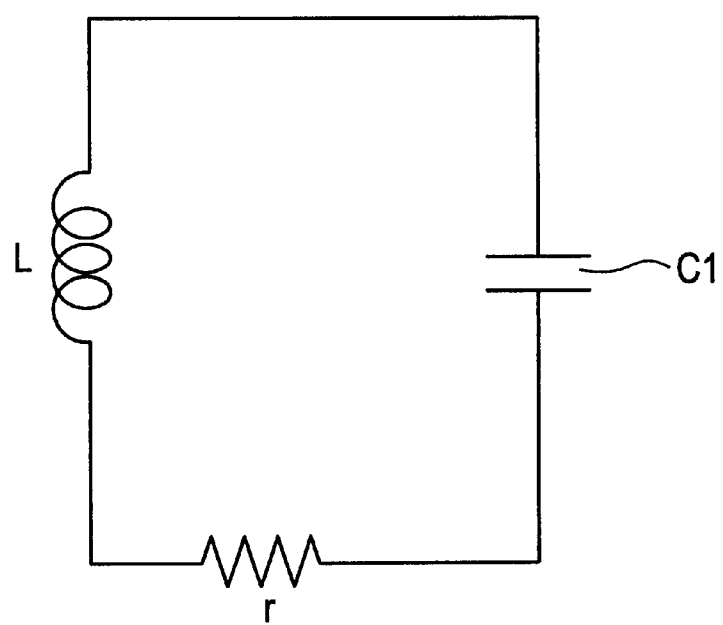
FIG. 9 is a diagram showing an equivalent circuit of the coil shown in FIG. 7.
Figure 10:
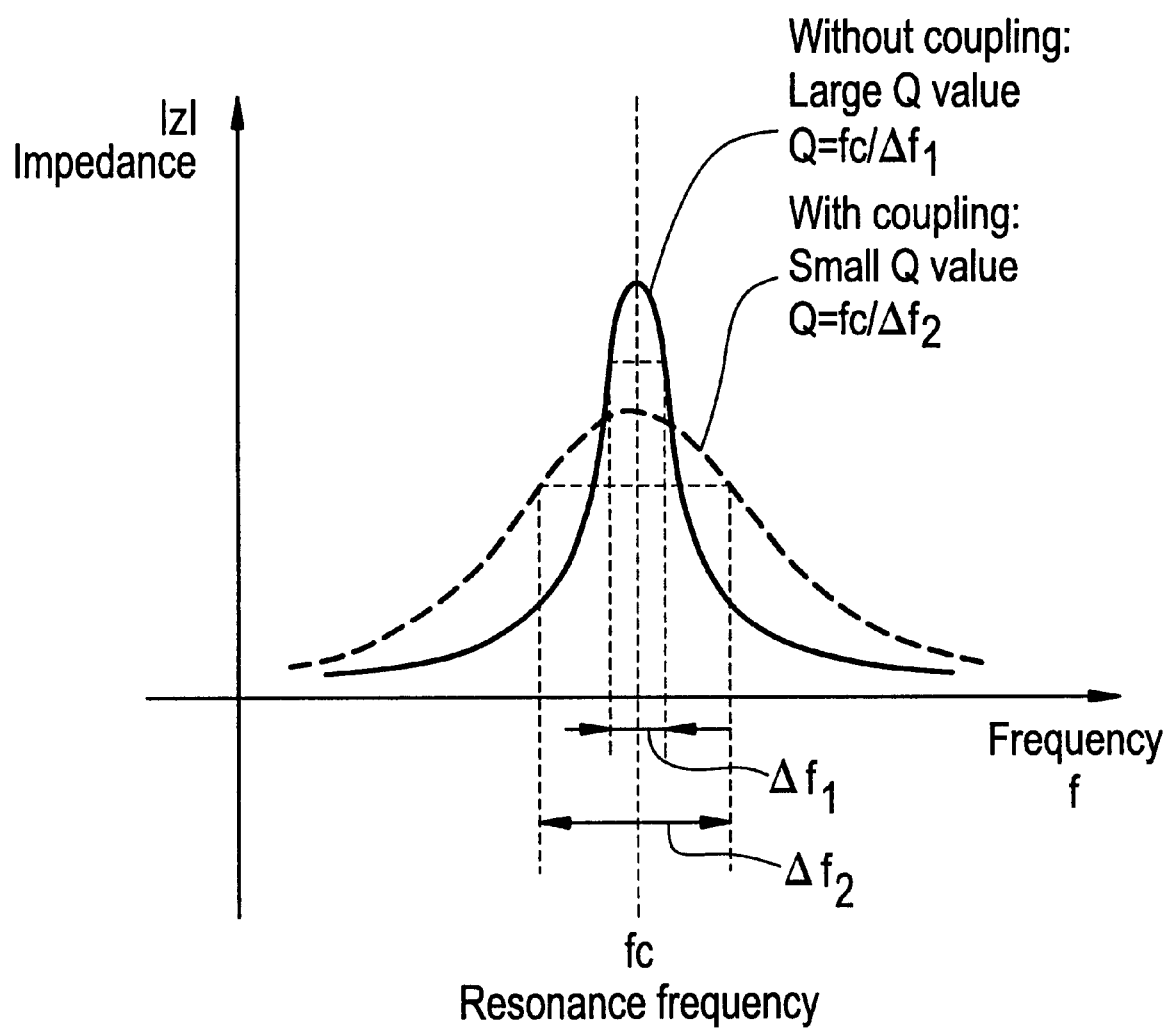
FIG. 10 is diagram showing the resonant characteristics of the coil.

Consequently, the coupling capacitance Ct at the pattern crossing section 11 based on Embodiment 1 decreases to ⅓ of the coupling capacitance C of the pattern crossing section 111 shown in FIG. 7.

Although the foregoing Embodiment 1 is designed to have partial conductor patterns of three branches at the pattern crossing section 11, the number of branches is not confined to this case, but further reduction of coupling capacitance is obviously possible based on an increased number of branches. Although the partial conductor patterns 22 to 24 and the partial conductor patterns 26 to 28 cross each other at right angles at the pattern crossing points 29 to 31, their orthogonal crossing is not compulsory. However, orthogonal crossing is preferable so that the crossing area is small. Although the partial conductor patterns 22 to 24 and 26 to 28 have an equal width, they may have different widths. However, an equal width is preferable so that the total crossing area is minimized.

Embodiment 1 has a reduced crossing area at the pattern crossing section 11 thereby to reduce the coupling capacitance significantly, whereby the coil 10 can have a large Q value and thus suppress the decay of an MRI tomographic image.

(Embodiment 2)

Next, Embodiment 2 of this invention will be explained. In contrast to the foregoing Embodiment 1 in which the partial conductor patterns 22 to 24 and 26 to 28 have their open ends connected by using the arcuate conductors 51 to 54, Embodiment 2 is designed to join the ends of partial conductor patterns and connect the joining portions to the conductor patterns 7a and 7b with conductor bars.

Figure 5:
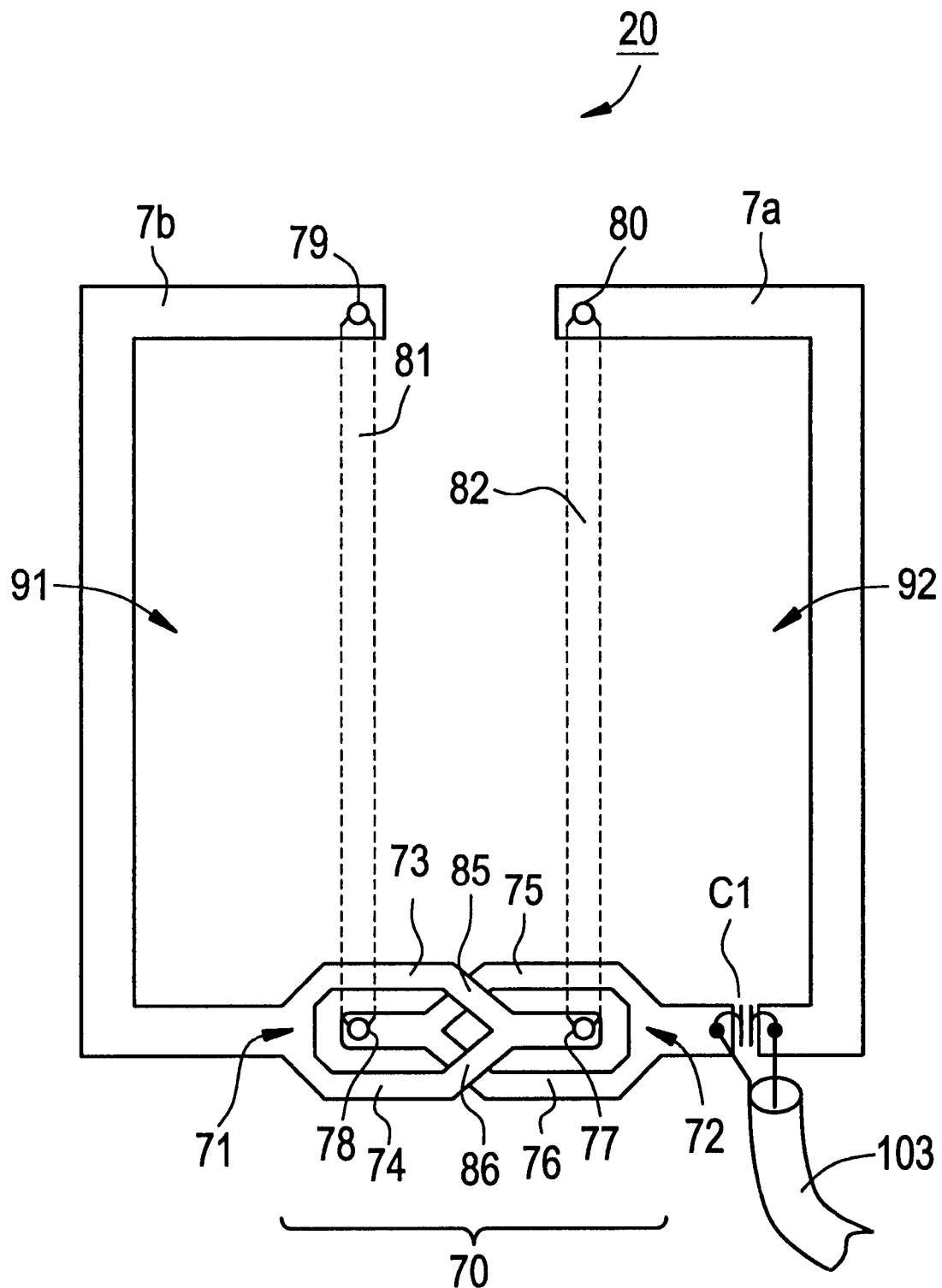
FIG. 5 is a development diagram showing the structure of the coil based on Embodiment 2 of this invention.
Figure 6:
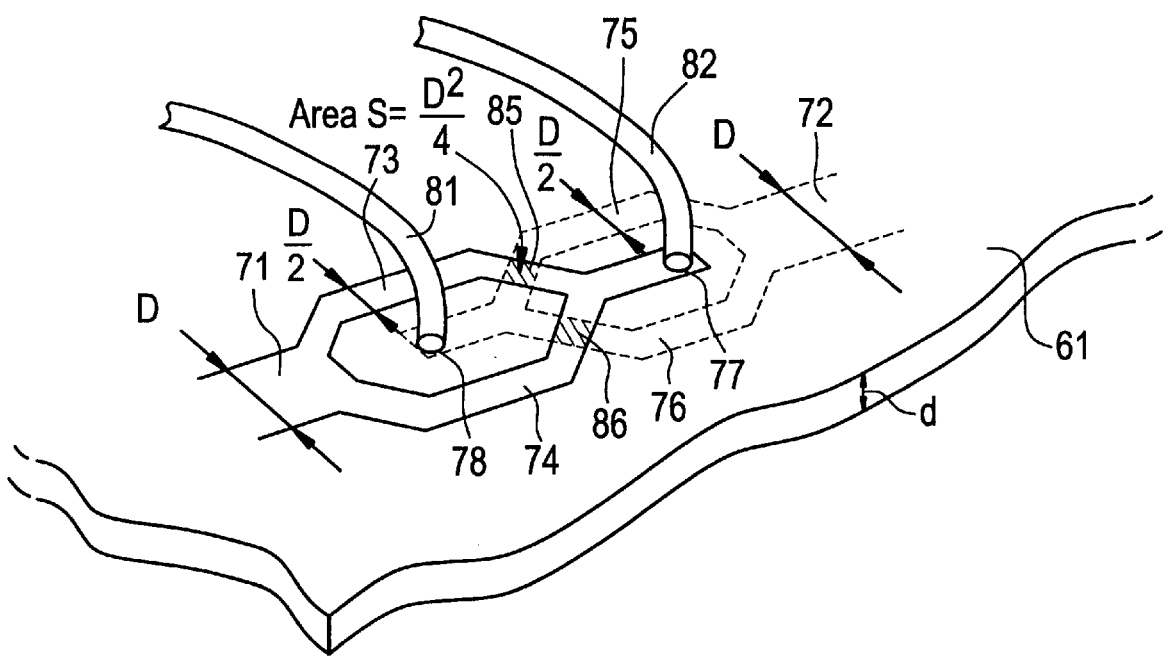
FIG. 6 is an enlarged perspective view of the pattern crossing section shown in FIG. 5.

FIG. 5 is a development diagram showing the structure of the coil based on Embodiment 2 of this invention. FIG. 6 is an enlarged perspective view of the pattern crossing section shown in FIG. 5. The coil 20 of Embodiment 2 differs in the structure of pattern crossing section 70 from the pattern crossing section 11 of Embodiment 1, and the remaining portions are identical to Embodiment 1.

In FIG. 5, the loop coils 91 and 92 are connected in series and arranged to cross each other by being insulated at the pattern crossing section 70. The loop coils 91 and 92 have conductor patterns 7a and 7b which form loops. The conductor pattern 7b has at the pattern crossing section 70 a partial conductor pattern set 71 of two branches of an equal width to include partial conductor patterns 73 and 74, which join again at their ends. The conductor pattern 7a has at the pattern crossing section 70 a partial conductor pattern set 72 of two branches of the equal width to include partial conductor patterns 75 and 76, which join again at their ends.

Disposed between the conductor pattern 7a and the partial conductor pattern set 72 is a resonance capacitor C1, which is connected to a cable section 103 for leading out the signal received by the coil 20. A balance/unbalance converting circuit such as an impedance matching circuit and balun is provided between the resonance capacitor C1 and the cable section 103.

The partial conductor patterns 73 and 74 cross the partial conductor patterns 75 and 76 at right angles at respective pattern crossing points 85 and 86. The partial conductor patterns 73 and 74 have their ends reaching and connecting to an outlet 77 which is formed between the partial conductor patterns 75 and 76. The outlet 77 is connected to a connection terminal 80 which is formed at another end of the conductor pattern 7a by a conductor bar 82 by being spaced out from the glass-epoxy substrate 61 by a prescribed distance.

Similarly, the partial conductor patterns 75 and 76 cross the partial conductor patterns 73 and 74 at right angles at respective pattern crossing points 85 and 86. The partial conductor patterns 75 and 76 have their ends reaching and connecting to an outlet 78 which is formed between the partial conductor patterns 73 and 74. The outlet 78 is connected to a connection terminal 79 which is formed at another end of the conductor pattern 7b by a conductor bar 81 by being spaced out from the glass-epoxy substrate 61 by the prescribed distance.

As shown in FIG. 6, the partial conductor pattern sets 71 and 72 are printed on the top and rear surfaces, respectively, of the glass-epoxy substrate 61 via the glass-epoxy substrate. For the conductor patterns 7a and 7b having a width of D, the partial conductor patterns 73 to 76 have a width D/2. The partial conductor patterns 73 and 74 and the partial conductor patterns 75 and 76 cross each other at right angles at the pattern crossing points 85 and 86.

Accordingly, each of the pattern crossing points 85 and 86 has its crossing area S expressed by the following formula (8).

$$S = D/2 \times D/2 = D \times D/4 \tag{8}$$

Substituting the crossing area S to the formula (1) gives the following formula (9).

$$C = \epsilon \cdot (D \times D/d)/4 \tag{9}$$

Due to the parallel connection of the two pattern crossing points 85 and 86, the total coupling capacitance Cu is expressed by the following formula (10).

$$Cu = \epsilon (D \times D/d)/2 \tag{10}$$

Consequently, the coupling capacitance Cu at the pattern crossing section 70 based on Embodiment 2 decreases to ½ of the coupling capacitance C of the pattern crossing section 111 shown in FIG. 7.

Although, in the foregoing Embodiment 2, the partial conductor patterns 73 and 74 and the partial conductor patterns 75 and 76 cross each other at right angles at the pattern crossing points 85 and 86, their orthogonal crossing is not compulsory. However, orthogonal crossing is preferable so that the crossing area is small. Although the partial conductor patterns 73 to 76 have an equal width, they may have different widths instead. However, an equal width is preferable so that the total crossing area is minimized.

Embodiment 2 has a reduced crossing area at the pattern crossing section 70 based on a simple structure thereby to reduce the coupling capacitance significantly, whereby the coil 20 can have a large Q value and thus suppress the decay of an MRI tomographic image. Although Embodiments 1 and 2 are designed to connect the outlets 40, 43, 77 and 78 to other ends 47, 46, 80 and 79 by using the conductor bars, conductor patterns may be formed in place of the conductor bars.

Many widely different embodiments of the invention may be configured without departing from the spirit and the scope of the present invention. It should be understood that the present invention is not limited to the specific embodiments described in the specification, except as defined in the appended claims.

What is claimed is:

1. A coil for an MRI apparatus which forms a plurality of loops and has an insulated crossing section, comprising:
    a first conductor pattern which forms a first loop and has its one end at the crossing section branching into a set of a prescribed number of first partial conductor patterns; and
    a second conductor pattern which forms a second loop and has its one end at the crossing section branching into a set of the prescribed number of second partial conductor patterns,
    each confronting pair of the first and second partial conductor pattern sets cross each other by being insulated from each other at the crossing section, and the adjacent first partial conductor patterns and adjacent second partial conductor patterns have their ends beyond the crossing section each connected together to other ends of the second conductor pattern and first conductor pattern by conductors which are spaced out from the second partial conductor patterns and first partial conductor patterns, respectively, by a prescribed distance or more.

2. The coil for an MRI apparatus according to claim 1, wherein the first and second partial conductor patterns cross each other at right angles.

3. The coil for an MRI apparatus according to claim 1, wherein the partial conductor patterns have a virtually equal width.

4. A coil for an MRI apparatus which forms a plurality of loops and has an insulated crossing section, comprising:
    a first conductor pattern which forms a first loop and has its one end at the crossing section branching into first partial conductor patterns of two in number; and
    a second conductor pattern which forms a second loop and has its one end at the crossing section branching into second partial conductor patterns of two in number,
    each confronting pair of the first and second partial conductor patterns cross each other by being insulated from each other at the crossing section, and the first partial conductor patterns and second partial conductor patterns have their ends beyond the crossing section each connected together to other ends of the second conductor pattern and first conductor pattern by conductors which are spaced out from the second partial conductor patterns and first partial conductor patterns, respectively, by a prescribed distance or more.

5. The coil for an MRI apparatus according to claim 2, wherein the first and second partial conductor patters cross each other at right angles.

6. The coil for an MRI apparatus according to claim 2, wherein the partial conductor patters have a virtual equal width.

* * * * *